(12) United States Patent
Ahn et al.

(10) Patent No.: US 9,685,952 B2
(45) Date of Patent: Jun. 20, 2017

(54) TRANSMITTER

(71) Applicants: SK hynix Inc., Icheon (KR);
Industry-University Cooperation Foundation Hanyang University, Seoul (KR)

(72) Inventors: Keun-Seon Ahn, Seongnam (KR);
Changsik Yoo, Seoul (KR); Chunseok Jeong, Seoul (KR)

(73) Assignees: SK HYNIX INC., Icheon (KR);
INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 15/065,659

(22) Filed: Mar. 9, 2016

(65) Prior Publication Data

US 2017/0117893 A1    Apr. 27, 2017

(30) Foreign Application Priority Data

Oct. 27, 2015  (KR) ..................... 10-2015-0149769

(51) Int. Cl.
*H03K 19/00* (2006.01)
*H03K 19/0185* (2006.01)

(52) U.S. Cl.
CPC . *H03K 19/0013* (2013.01); *H03K 19/018521* (2013.01)

(58) Field of Classification Search
CPC .................................................. H03K 19/0013
See application file for complete search history.

(56) References Cited

U.S. PATENT DOCUMENTS

| 6,255,867 | B1 * | 7/2001 | Chen | ................ H03K 19/00361 327/108 |
| 8,350,603 | B2 | 1/2013 | Chen | |
| 8,471,601 | B2 * | 6/2013 | Meninger | ................ H03K 5/02 327/108 |
| 2012/0092057 | A1 | 4/2012 | Yu | |

* cited by examiner

*Primary Examiner* — Hai L Nguyen

(57) ABSTRACT

A transmitter operates by receiving a first power supply voltage and a second power supply voltage lower than the first power supply voltage, and includes a driving circuit that generates an output signal according to a driving control signal, a swing adjustment block that adjusts a swing width of the output signal to be lower than a difference between the first power supply voltage and the second power supply voltage in response to a swing control signal, and a swing control signal generation circuit that generates the swing control signal based on the output signal.

20 Claims, 5 Drawing Sheets

FIG. 1 <PRIOR ART>

TRANSMITTER

The present application claims priority under 35 U.S.C. §119(a) to Korean Patent Application Number 10-2015-0149769, filed on Oct. 27, 2015, in the Korean Intellectual Property Office, which is incorporated herein by reference in its entirety as set forth in full.

BACKGROUND

1. Technical Field

The present disclosure relates to a transmitter. Particularly, embodiments of the present disclosure relate to a transmitter capable of reducing power consumption by reducing a swing width of a transmission signal.

2. Related Art

FIG. 1 is a circuit diagram of a conventional transmitter.

The conventional transmitter includes a driving circuit 1 and a driving signal generation circuit 2.

The driving circuit 1 outputs an output signal VO, which swings between a power supply voltage VDD and a ground voltage VSS, in response to a driving control signal outputted from the driving signal generation circuit 2.

The driving circuit 1 includes a PMOS transistor P0 and an NMOS transistor N0, which have drains commonly coupled to each other. The output signal VO is outputted from the commonly coupled drains.

The power supply voltage VDD is provided to a source of the PMOS transistor P0 and the ground voltage VSS is provided to a source of the NMOS transistor N0.

The driving signal generation circuit 2 includes a NAND gate ND1 that performs a NAND operation on a data signal D and an activation signal EN to control a gate of the PMOS transistor P0, an inverter INV0 that inverts the activation signal EN, and a NOR gate NR1 that performs a NOR operation on an output signal of the inverter INV0 and the data signal D to control a gate of the NMOS transistor N0.

When the activation signal EN has a logic low level, since an output signal of the NAND gate ND1 has a logic high level and an output signal of the NOR gate NR1 has a logic low level, the PMOS transistor P0 and the NMOS transistor N0 are turned off and the output signal VO is in a floating state.

When the activation signal EN has a logic high level, if the data signal D has a logic high level, the output signal of the NAND gate ND1 and the output signal of the NOR gate NR1 respectively become to have a logic low level. Accordingly, the PMOS transistor P0 is turned on and the NMOS transistor N0 is turned off. As a result, the output signal VO has the power supply voltage VDD.

On the other hand, when the activation signal EN has the logic high level, if the data signal D has a logic low level, the output signal of the NAND gate ND1 and the output signal of the NOR gate NR1 respectively become to have a logic high level. Accordingly, the PMOS transistor P0 is turned off and the NMOS transistor N0 is turned on. As a result, the output signal VO has the ground voltage VSS.

As described above, in the conventional transmitter, since the output signal VO fully swings between the power supply voltage VDD and the ground voltage VSS, power consumption may be significant due to the full switching operation of the transmitter.

SUMMARY

Embodiments of the present disclosure provide a transmitter that reduces power consumption by reducing a swing width of an output signal. Furthermore, embodiments of the present disclosure provide a transmitter capable of variably reducing a swing width of an output signal in response to a control signal.

In one embodiment of the present invention, a transmitter includes: a driving circuit that generates an output signal according to a driving control signal; a swing adjustment block that adjusts a swing width of the output signal to be lower than a difference between a first power supply voltage and a second power supply voltage in response to a swing control signal; and a swing control signal generation circuit that generates the swing control signal based on the output signal. In the embodiment, the second power supply voltage has a lower potential than the first power supply voltage.

According to embodiments of the present disclosure, a swing width of an output voltage of a transmitter is reduced, such that power consumption due to a switching operation of the transmitter is reduced. The swing width is reduced, and thus noise due to the switching operation is reduced, resulting in the improvement of the quality of a transmission signal. In addition, according to the embodiments, the swing width is variably reduced, and thus it is possible to set an optimal swing width according to driving environments.

BRIEF DESCRIPTION OF THE DRAWINGS

Features, aspects, and embodiments are described in conjunction with the attached drawings, in which.

DETAILED DESCRIPTION

Hereinafter, transmitters according to embodiments of the present disclosure will be described in detail with reference to the accompanying drawings.

Figure 2:
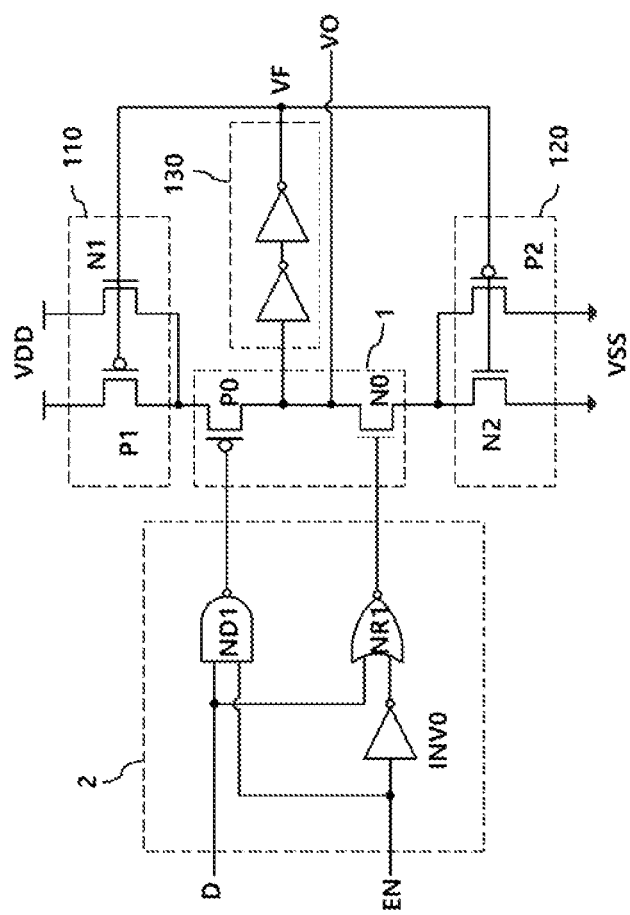
FIG. 2 is a circuit diagram of a transmitter according to an embodiment of the present disclosure.

FIG. 2 is a circuit diagram of a transmitter according to an embodiment of the present disclosure.

The transmitter includes a driving circuit 1, a driving signal generation circuit 2, a first swing adjustment circuit 110, a second swing adjustment circuit 120, and a swing control signal generation circuit 130.

Figure 1:
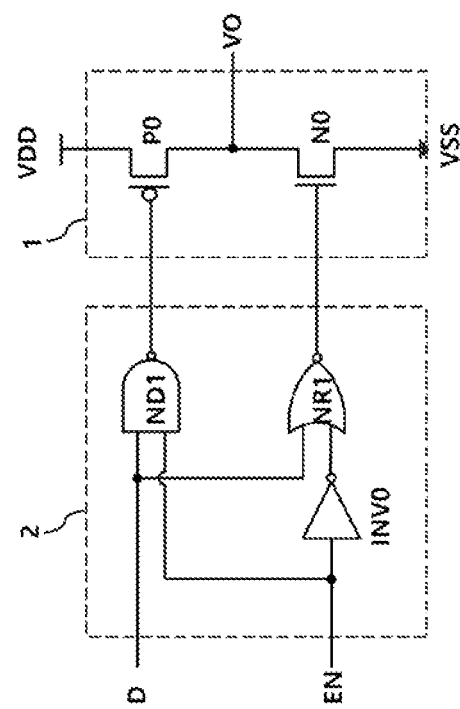
FIG. 1 is a circuit diagram of a conventional transmitter.

The driving circuit 1 and the driving signal generation circuit 2 are substantially the same as those illustrated in FIG. 1.

The first swing adjustment circuit 110 is coupled to and disposed between a terminal of a power supply voltage VDD and the driving circuit 1 and sets a voltage of an output signal VO to be lower than the power supply voltage VDD.

The first swing adjustment circuit 110 includes a first current supply element, e.g., a PMOS transistor P1, and a voltage drop element, an NMOS transistor N1. The PMOS transistor P1 and the NMOS transistor N1 are coupled in parallel to each other between the terminal of the power supply voltage VDD and a source of a PMOS transistor P0 of the driving circuit 1.

The second swing adjustment circuit 120 is coupled to and disposed between a terminal of a ground voltage VSS and the driving circuit 1 and sets the voltage of the output signal VO to be higher than the ground voltage VSS.

The second swing adjustment circuit 120 includes a second current supply element, e.g., a PMOS transistor P2, and a voltage increasing element, e.g., an NMOS transistor N2. The PMOS transistor P2 and the NMOS transistor N2 are coupled in parallel to each other between the terminal of the ground voltage VSS and a source of an NMOS transistor N0 of the driving circuit 1.

The swing control signal generation circuit 130 delays the output signal VO by a predetermined time and outputs a swing control signal VF. The swing control signal VF is inputted to gates of the PMOS transistor P1 and the NMOS transistor N1 included in the first swing adjustment circuit 110 and gates of the PMOS transistor P2 and the NMOS transistor N2 included in the second swing adjustment circuit 120.

Figure 3:
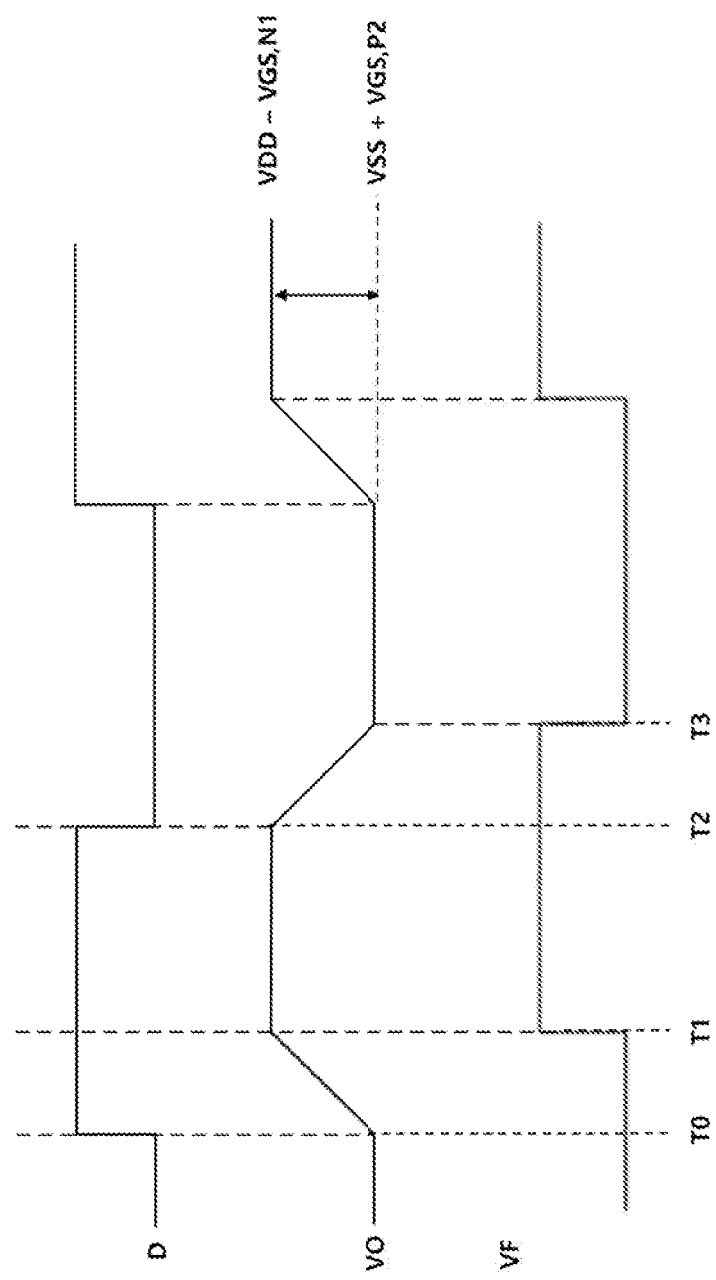
FIG. 3 is a timing diagram illustrating an operation of the transmitter of FIG. 2.

FIG. 3 is a timing diagram illustrating an operation of the transmitter of FIG. 2.

With reference to FIG. 3, the operation of the transmitter of FIG. 2 will be described.

While an activation signal EN is enabled to a logic high level, at a point of time T0, since the swing control signal VF is initialized at a logic low level, the PMOS transistor P1 of the first swing adjustment circuit 110 is turned on. At the point of time T0, when a data signal D transitions from a logic low level to a logic high level, the PMOS transistor P0 of the driving circuit 1 is turned on, and the NMOS transistor N0 of the driving circuit 1 is turned off.

Accordingly, while both of the PMOS transistor P1 and the PMOS transistor P0 are turned on, the voltage of the output signal VO gradually increases.

As the voltage of the output signal VO gradually increases, a logic level of the swing control signal VF is inverted at a point of time T1 after a preset time passes from the point of time T0.

When the swing control signal VF transitions from the logic low level to a logic high level, in the first swing adjustment circuit 110, the PMOS transistor P1 is turned off, and instead the NMOS transistor N1 is turned on.

Accordingly, a source voltage of the PMOS transistor P0 of the driving circuit 1 is obtained by subtracting a gate-source voltage of the NMOS transistor N1 from the power supply voltage VDD, and the source voltage is output as the output signal VO. The output signal VO maintains a stabilized state, e.g., an upper end voltage of a swing width, until the data signal D changes its logic level again.

At a point of time T2, the data signal D transitions from the logic high level to the logic low level. At the point of time T2, since the swing control signal VF maintains the logic high level, the NMOS transistor N2 of the second swing adjustment circuit 120 is still turned on. When the data signal D transitions to the logic low level and the activation signal EN is still in an activation state, the NMOS transistor N0 of the driving circuit 1 is turned on, and the POMS transistor P0 of the driving circuit 1 is turned off. Accordingly, the voltage of the output signal VO gradually decreases.

As the voltage of the output signal VO gradually decreases, the logic level of the swing control signal VF is inverted at a point of time T3 after a preset time passes from the point of time T2.

When the swing control signal VF transitions from the logic high level to the logic low level, in the second swing adjustment circuit 120, the NMOS transistor N2 is turned off, and instead the PMOS transistor P2 is turned on.

Accordingly, a source voltage of the NMOS transistor N0 of the driving circuit 1 is obtained by adding a gate-source voltage of the PMOS transistor P2 to the ground voltage VSS, and the source voltage of the NMOS transistor N0 is output as the voltage of the output signal VO. The output signal VO maintains a stabilized state, e.g., a lower end voltage of the swing width, until the data signal D changes its logic level again.

As described above, the voltage of the output signal VO swings between the upper end voltage and the lower end voltage, e.g., between a first voltage (VDD−VGS,N1) and a second voltage (VSS+VGS,P2), wherein the VGS,N1 represents the gate-source voltage of the NMOS transistor N1, and the VGS,P2 represents the gate-source voltage of the PMOS transistor P2.

As a result, in the transmitter of FIG. 2, a swing width of the output signal VO is reduced as compared with the conventional art in which an output signal VO fully swings between the power supply voltage VDD and the ground voltage VSS.

Figure 4:
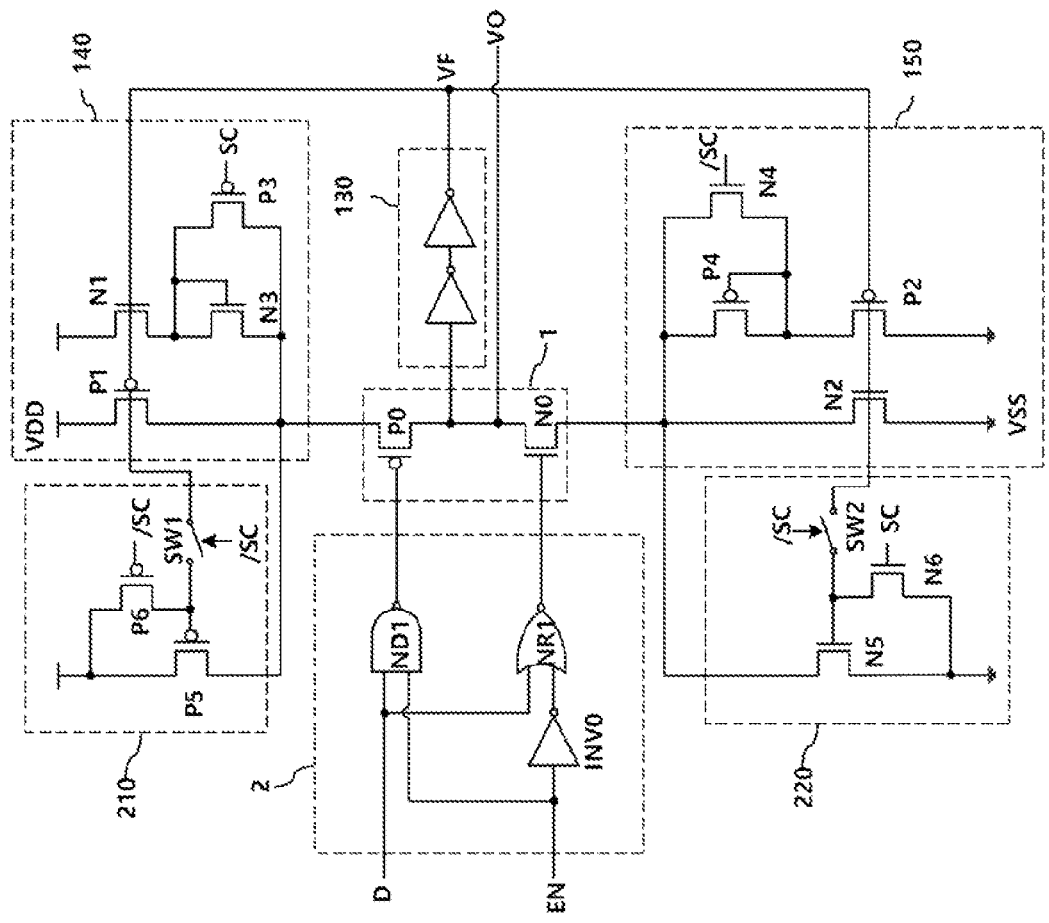
FIG. 4 is a circuit diagram of a transmitter according to another embodiment of the present disclosure.

FIG. 4 is a circuit diagram of a transmitter according to another embodiment of the present disclosure.

In the transmitter of FIG. 4, it is possible to variably control a swing width of an output signal VO using a switching control signal SC.

The transmitter includes a driving circuit 1, a driving signal generation circuit 2, a first swing adjustment circuit 140, a second swing adjustment circuit 150, and a swing control signal generation circuit 130.

The driving circuit 1 and the driving signal generation circuit 2 are substantially the same as those illustrated in FIG. 1.

The first swing adjustment circuit 140 is coupled to and disposed between a terminal of a power supply voltage VDD and the driving circuit 1, and sets a voltage of an output signal VO to be lower than the power supply voltage VDD.

The first swing adjustment circuit 140 includes PMOS transistors P1 and P3 and NMOS transistors N1 and N3.

The PMOS transistor P1 is coupled to and disposed between the terminal of the power supply voltage VDD and a source of a PMOS transistor P0 of the driving circuit 1. The PMOS transistor P1 functions as a current supply element.

The NMOS transistor N1 is coupled to and disposed between the terminal of the power supply voltage VDD and the NMOS transistor N3. The NMOS transistor N1 functions as a first voltage drop element.

A swing control signal VF is applied to gates of the PMOS transistor P1 and the NMOS transistor N1.

The NMOS transistor N3 has a drain and a gate that are commonly coupled to each other, and the NMOS transistor N3 is coupled to and disposed between the NMOS transistor N1 and the PMOS transistor P0 of the driving circuit 1. The NMOS transistor N3 functions as a second voltage drop element.

The PMOS transistor P3 is coupled to and disposed between both ends of the NMOS transistor N3, and receives the switching control signal SC through a gate thereof. Thus, the PMOS transistor P3 is also coupled to and disposed between the NMOS transistor N1 and the PMOS transistor P0 of the driving circuit 1.

When the switching control signal SC is set to a logic low level, the PMOS transistor P3 is turned on, and thus the NMOS transistor N1 is substantially and directly coupled to the PMOS transistor P0. This case is substantially the same as the case illustrated in FIG. 2.

On the other hand, when the switching control signal SC is set to a logic high level, the PMOS transistor P3 is turned off, and thus the diode-coupled NMOS transistor N3 disposed between a source of the NMOS transistor N1 and the source of the PMOS transistor P0 functions as the second voltage drop element.

The second swing adjustment circuit 150 is coupled to and disposed between a terminal of a ground voltage VSS and the driving circuit 1, and sets the voltage of the output signal VO to be higher than the ground voltage VSS.

The second swing adjustment circuit 150 includes PMOS transistors P2 and P4 and NMOS transistors N2 and N4.

The NMOS transistor N2 is coupled to and disposed between the terminal of the ground voltage VSS and a source of an NMOS transistor N0 of the driving circuit 1. The NMOS transistor N2 functions as a current supply element.

The PMOS transistor P2 is coupled to and disposed between the terminal of the ground voltage VSS and the PMOS transistor P4. The PMOS transistor P2 functions as a first voltage increasing element.

The swing control signal VF is applied to gates of the PMOS transistor P2 and the NMOS transistor N2.

The PMOS transistor P4 has a drain and a gate that are commonly coupled to each other, and the PMOS transistor P4 is coupled to and disposed between the PMOS transistor P2 and the NMOS transistor N0 of the driving circuit 1. The PMOS transistor P4 functions as a second voltage increasing element.

The NMOS transistor N4 is coupled to and disposed between both ends of the PMOS transistor P4, and receives an inverted switching control signal/SC through a gate thereof. Thus, the NMOS transistor N4 is also coupled to and disposed between the PMOS transistor P2 and the NMOS transistor N0 of the driving circuit 1.

When the inverted switching control signal/SC is set to a logic high level, the NMOS transistor N4 is turned on, and thus the PMOS transistor P2 is substantially and directly coupled to the NMOS transistor N0. This case is substantially the same as the case illustrated in FIG. 2.

On the other hand, when the inverted switching control signal/SC is set to a logic low level, the NMOS transistor N4 is turned off, and thus the diode-coupled PMOS transistor P4 disposed between a source of the PMOS transistor P2 and a source of the NMOS transistor N0 functions as the second voltage increasing element.

Accordingly, in the present embodiment, when the switching control signal SC is set to a logic low level, a swing width of the output signal VO further increases compared to when the switching control signal SC is set to a logic high level. This will be described in detail with reference to FIG. 5.

The swing control signal generation circuit 130 delays the output signal VO by a predetermined time, and outputs the swing control signal VF.

The transmitter according to the present embodiment may further include a first current supply circuit 210 and a second current supply circuit 220.

The first current supply circuit 210 and the second current supply circuit 220 provide an additional driving current to the driving circuit 1 in response to the switching control signal SC when the swing width of the output signal VO further increases, i.e., when the switching control signal SC has a logic low level.

The first current supply circuit 210 includes PMOS transistors P5 and P6 and a first switch SW1.

The PMOS transistor P5 is coupled to and disposed between the terminal of the power supply voltage VDD and the PMOS transistor P0. The PMOS transistor P5 functions as a current supply element.

The first switch SW1 selectively applies the swing control signal VF to a gate of the PMOS transistor P5 in response to the inverted switching control signal/SC.

The PMOS transistor P6 is coupled to and disposed between a source and the gate of the PMOS transistor P5, and receives the inverted switching control signal/SC through a gate thereof.

When the inverted switching control signal/SC is set to a logic high level, the first switch SW1 is turned on and the PMOS transistor P6 is turned off. Thus, the PMOS transistor P5 plays a role of additionally supplying a current to the source of the PMOS transistor P0 of the driving circuit 1 in response to the swing control signal VF.

On the other hand, when the inverted switching control signal/SC is set to a logic low level, the first switch SW1 is turned off and the PMOS transistor P6 is turned on to substantially prevent a gate voltage of the PMOS transistor P5 from entering a floating state and to fix the gate voltage of the PMOS transistor P5 to the power supply voltage, thereby allowing the PMOS transistor P5 to be in a turned-off state.

The second current supply circuit 220 includes NMOS transistors N5 and N6 and a second switch SW2.

The NMOS transistor N5 is coupled to and disposed between the terminal of the ground voltage VSS and the NMOS transistor N0. The NMOS transistor N5 functions as a current supply element.

The second switch SW2 selectively applies the swing control signal VF to a gate of the NMOS transistor N5 in response to the inverted switching control signal/SC.

The NMOS transistor N6 is coupled to and disposed between a source and the gate of the NMOS transistor N5, and receives the switching control signal SC through a gate thereof.

When the switching control signal SC is set to a logic low level, the second switch SW2 is turned on and the NMOS transistor N6 is turned off. Thus, the NMOS transistor N5 plays a role of additionally supplying a current to the driving circuit 1 in response to the swing control signal VF.

On the other hand, when the switching control signal SC is set to a logic high level, the second switch SW2 is turned off and the NMOS transistor N6 is turned on to substantially prevent a gate voltage of the NMOS transistor N5 from entering a floating state and to fix the gate voltage of the NMOS transistor N5 to the ground voltage VSS, thereby allowing the NMOS transistor N5 to be in a turned-off state.

As described above, when a swing width increases, the first current supply circuit 210 and the second current supply circuit 220 supply an additional current to the driving circuit 1, thereby improving a switching speed of the output signal VO.

Figure 5:
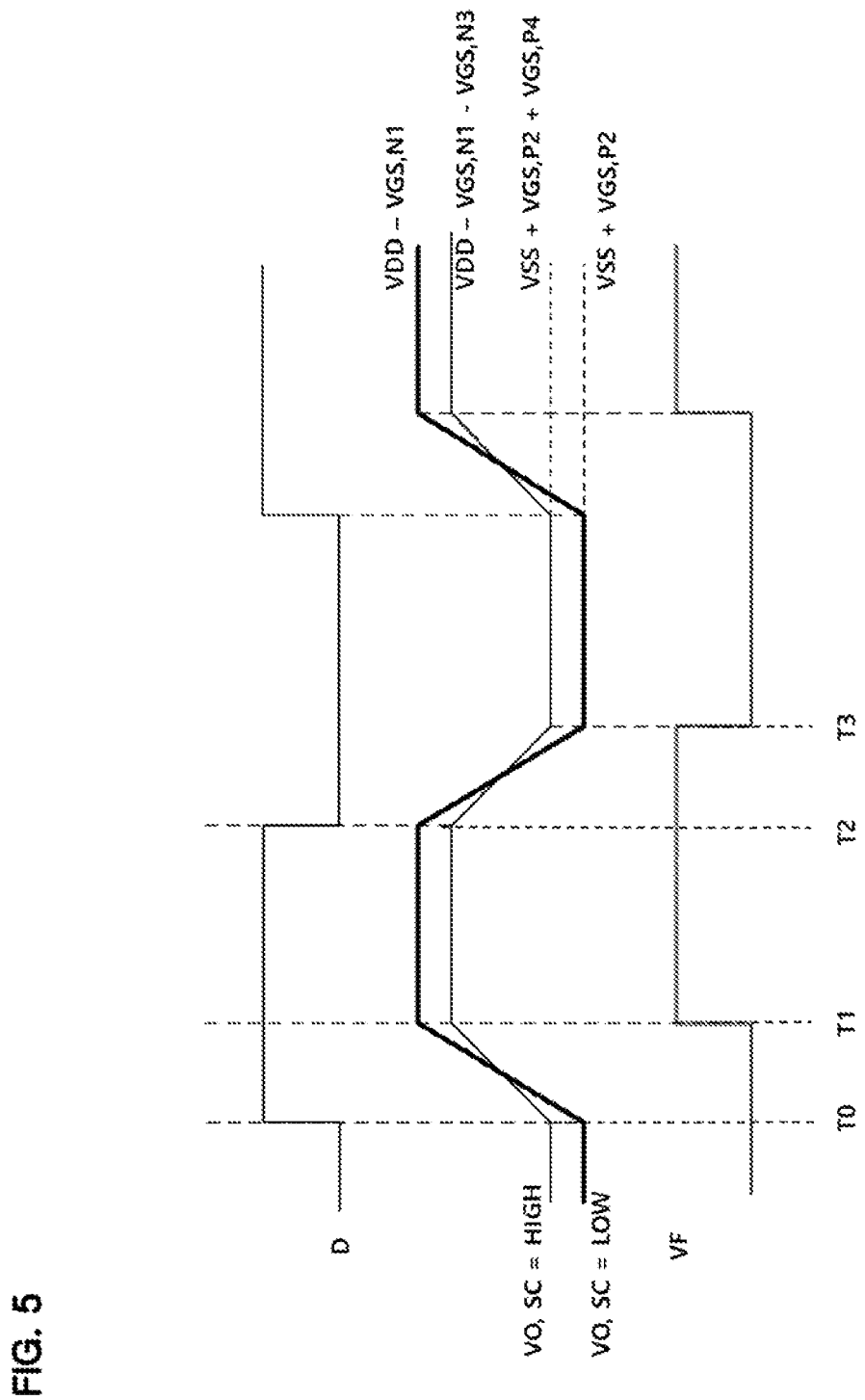
FIG. 5 is a timing diagram illustrating an operation of the transmitter of FIG. 4.

FIG. 5 is a timing diagram illustrating an operation of the transmitter of FIG. 4.

With reference to FIG. 5, the operation of the transmitter of FIG. 4 will be described.

As described above, since the operation of the transmitter of FIG. 4 is substantially the same as that of the transmitter of FIG. 2 except that an additional current is provided to the driving circuit 1 through the first current supply circuit 210 and the second current supply circuit 220 when the switching control signal SC is set to a logic low level, the following description will be given based on the case in which the switching control signal SC is set to a logic high level.

While the activation signal EN is enabled to a logic high level, at a point of time T0, since the swing control signal VF is initialized to a logic low level, when a data signal D transitions from a logic low level to a logic high level, both of the PMOS transistor P0 of the driving circuit 1 and the PMOS transistor P1 of the first swing adjustment circuit 140 are turned on, and the NMOS transistor N0 is turned off. Accordingly, a voltage of the output signal VO gradually increases.

As the voltage of the output signal VO gradually increases, a logic level of the swing control signal VF is inverted at a point of time T1 after a preset time passes from the point of time T0. Accordingly, at the point of time T1, in the first swing adjustment circuit 140, the PMOS transistor P1 is turned off, and instead the NMOS transistor N1 is turned on.

Since the NMOS transistor N3 is in a diode-coupled state, a voltage difference between both ends of the NMOS transistor N3 is substantially equal to a gate-source voltage of the NMOS transistor N3.

Accordingly, a source voltage of the PMOS transistor P0 of the driving circuit 1 is obtained by subtracting a gate-source voltage of the NMOS transistor N1 and the gate-source voltage of the NMOS transistor N3 from the power supply voltage VDD, and the source voltage of the PMOS transistor P0 is output as the voltage of the output signal VO. The output signal VO maintains a stabilized state, e.g., an upper end voltage of a swing width, until the data signal D changes its logic level again.

At a point of time T2, when the data signal D transitions from the logic high level to the logic low level, since the swing control signal VF maintains a logic high level, both of the NMOS transistor N0 of the driving circuit 1 and the NMOS transistor N2 of the second swing adjustment circuit 150 are turned on, and the PMOS transistor P0 of the driving circuit 1 is turned off. Accordingly, the voltage of the output signal VO gradually decreases.

As the voltage of the output signal VO gradually decreases, a level of the swing control signal VF is inverted at a point of time T3 after a preset time passes after the point of time T2.

Accordingly, in the second swing adjustment circuit 150, the NMOS transistor N2 is turned off, and instead the PMOS transistor P2 is turned on.

Since the PMOS transistor P4 is in a diode-coupled state, a voltage difference between both ends of the PMOS transistor P4 is substantially equal to a gate-source voltage of the PMOS transistor P4.

Accordingly, a source voltage of the NMOS transistor N0 of the driving circuit 1 is obtained by adding a gate-source voltage of the PMOS transistor P2 and the gate-source voltage of the PMOS transistor P4 to the ground voltage VSS, and the source voltage of the NMOS transistor N0 is output as the voltage of the output signal VO. The output signal VO maintains a stabilized state, e.g., a lower end voltage of the swing width, until the data signal D changes its logic level again.

As described above, the voltage of the output signal VO swings between the upper end voltage and the lower end voltage, e.g., between a first voltage (VDD−VGS,N1−VGS,N3) and a second voltage (VSS+VGS,P2+VGS,P4), wherein the VGS,N1 represents the gate-source voltage of the NMOS transistor N1, the VGS,P2 represents the gate-source voltage of the PMOS transistor P2, the VGS,N3 represents the gate-source voltage of the NMOS transistor N3, and the VGS,P4 represents the gate-source voltage of the PMOS transistor P4.

As a result, in the transmitter of FIG. 4, the swing width of the output signal VO is reduced as compared with the conventional art. Furthermore, in the transmitter of FIG. 4, it is possible to further reduce the swing width of the output signal VO using the switching control signal SC.

The embodiment, in which the first swing adjustment circuit 110 (or 140) and the second swing adjustment circuit 120 (or 150) are coupled to the driving circuit 1, has been described. However, according to another embodiment, any one of the first swing adjustment circuits 110 and 140 and any one of the second swing adjustment circuits 120 and 150 may be selectively included.

Furthermore, those skilled in the art will easily understand that an embodiment selectively includes any one of the first current supply circuit 210 and the second current supply circuit220.

The embodiment, in which the power supply voltage VDD and the ground voltage VSS are applied to the transmitter, has been described. However, those skilled in the art will easily understand that an embodiment may supply a first power supply voltage instead of the power supply voltage VDD and a second power supply voltage having a level lower than that of the first power supply voltage instead of the ground voltage VSS.

While certain embodiments have been described above, it will be understood to those skilled in the art that the embodiments described above are by way of example only. Accordingly, the transmitter described herein should not be limited based on the described embodiments. Rather, the transmitter described herein should only be limited in light of the claims that follow when taken in conjunction with the above description and accompanying drawings.

What is claimed is:

1. A transmitter, comprising:
   a driving circuit that generates an output signal according to a driving control signal;
   a swing adjustment block that adjusts a swing width of the output signal to be smaller than a difference between a first power supply voltage and a second power supply voltage in response to a swing control signal; and
   a swing control signal generation circuit that generates the swing control signal based on the output signal,
   wherein the second power supply voltage has a lower potential than the first power supply voltage.

2. The transmitter according to claim 1, wherein the swing adjustment block comprises:
   a first swing adjustment circuit that adjusts an upper end voltage of the swing width of the output signal to be lower than the first power supply voltage in response to the swing control signal.

3. The transmitter according to claim 2, wherein the first swing adjustment circuit comprises:
   a first current supply element that provides a current to the driving circuit during a transition period of the output signal; and
   a first voltage drop element that sets the upper end voltage to a first voltage lower than the first power supply voltage in a period in which the output signal is in a stabilized state.

4. The transmitter according to claim 3, wherein the first current supply element includes a PMOS transistor and the first voltage drop element includes an NMOS transistor, the PMOS transistor and the NMOS transistor being disposed between a terminal of the first power supply voltage and the driving circuit and alternately operating in response to the swing control signal.

5. The transmitter according to claim 3, wherein the first swing adjustment circuit further comprises:
   a second voltage drop element that sets the upper end voltage to a second voltage lower than the first voltage in response to a switching control signal in the period in which the output signal is in the stabilized state.

6. The transmitter according to claim 5, further comprising:
a second current supply element that additionally provides a current to the driving circuit in response to the swing control signal during the transition period of the output signal, when the first current supply element operates.

7. The transmitter according to claim 6, wherein the second current supply element includes a PMOS transistor, the PMOS transistor being disposed between a terminal of the first power supply voltage and the driving circuit, and operating in response to the swing control signal when the first current supply element operates.

8. The transmitter according to claim 5, wherein the second voltage drop element is disposed between the first voltage drop element and the driving circuit.

9. The transmitter according to claim 1, wherein the swing control signal generation circuit generates the swing control signal by delaying the output signal by a predetermined time.

10. The transmitter according to claim 1, wherein the swing adjustment block comprises:
a second swing adjustment circuit that adjusts a lower end voltage of the swing width of the output signal to be higher than the second power supply voltage in response to the swing control signal.

11. The transmitter according to claim 10, wherein the second swing adjustment circuit comprises:
a third current supply element that provides a current to the driving circuit during a transition period of the output signal; and
a first voltage increasing element that sets the lower end voltage to a third voltage higher than the second power supply voltage in a period in which the output signal is in a stabilized state.

12. The transmitter according to claim 11, wherein the third current supply element includes an NMOS transistor and the first voltage increasing element includes a PMOS transistor, the NMOS transistor and the PMOS transistor being disposed between the driving circuit and a terminal of the second power supply voltage, and alternately operating in response to the swing control signal.

13. The transmitter according to claim 11, wherein the second swing adjustment circuit further comprises:
a second voltage increasing element that sets the lower end voltage to a fourth voltage higher than the third voltage in response to a switching control signal in the period in which the output signal is in the stabilized state.

14. The transmitter according to claim 13, further comprising:
a fourth current supply element that additionally provides a current to the driving circuit in response to the swing control signal during the transition period of the output signal, when the third current supply element operates.

15. The transmitter according to claim 14, wherein the fourth current supply element includes an NMOS transistor, the NMOS transistor being disposed between the driving circuit and a terminal of the second power supply voltage, and operating in response to the swing control signal when the third current supply element operates.

16. The transmitter according to claim 13, wherein the second voltage increasing element is disposed between the driving circuit and the first voltage increasing element.

17. The transmitter according to claim 1, wherein the swing adjustment block comprises:
a first swing adjustment circuit that adjusts an upper end voltage of the swing width of the output signal to be lower than the first power supply voltage in response to the swing control signal; and
a second swing adjustment circuit that adjusts a lower end voltage of the swing width of the output signal to be higher than the second power supply voltage in response to the swing control signal.

18. The transmitter according to claim 17, wherein the first swing adjustment circuit comprises:
a first current supply element that provides a current to the driving circuit during a first transition period of the output signal; and
a first voltage drop element that sets the upper end voltage to a first voltage lower than the first power supply voltage in a period in which the output signal is in a first stabilized state, and
wherein the second swing adjustment circuit comprises:
a second current supply element that provides a current to the driving circuit during a second transition period of the output signal; and
a first voltage increasing element that sets the lower end voltage to a second voltage higher than the second power supply voltage in a period in which the output signal is in a second stabilized state.

19. The transmitter according to claim 18, wherein the first swing adjustment circuit further comprises:
a second voltage drop element that sets the upper end voltage to a third voltage lower than the first voltage in response to a switching control signal in the period in which the output signal is in the first stabilized state, and
wherein the second swing adjustment circuit further comprises:
a second voltage increasing element that sets the lower end voltage to a fourth voltage higher than the second voltage in response to the switching control signal in the period in which the output signal is in the second stabilized state.

20. The transmitter according to claim 19, further comprising:
a third current supply element that additionally provides a current to the driving circuit in response to the swing control signal during the first transition period of the output signal, when the first current supply element operates; and
a fourth current supply element that additionally provides a current to the driving circuit in response to the swing control signal during the second transition period of the output signal, when the second current supply element operates.

* * * * *